(12) United States Patent
Ong et al.

(10) Patent No.: US 7,443,018 B2
(45) Date of Patent: Oct. 28, 2008

(54) INTEGRATED CIRCUIT PACKAGE SYSTEM INCLUDING RIBBON BOND INTERCONNECT

(75) Inventors: You Yang Ong, Singapore (SG); Kwang Yong Chung, Selongor (MY); Mohd Helmy Bin Ahmad, Johor Bahru (MY); Garrett L. Wong, Orange, CA (US); Christoph B. Luechinger, Irvine, CA (US)

(73) Assignees: Stats Chippac Ltd., Singapore (SG); Orthodyne Electronics Corporation, Irvine, CA (US)

( * ) Notice: Subject to any disclaimer, the term of this patent is extended or adjusted under 35 U.S.C. 154(b) by 0 days.

(21) Appl. No.: 11/164,087

(22) Filed: Nov. 9, 2005

(65) Prior Publication Data

US 2007/0108601 A1 May 17, 2007

(51) Int. Cl.
*H01L 23/04* (2006.01)
*H01L 23/48* (2006.01)
*H01L 23/52* (2006.01)
*H01L 29/40* (2006.01)

(52) U.S. Cl. .................. 257/692; 257/688; 257/698; 257/784; 257/786

(58) Field of Classification Search ............ 257/688, 257/692, 698, 784, 786
See application file for complete search history.

(56) References Cited

U.S. PATENT DOCUMENTS

| | | | | | |
|---|---|---|---|---|---|
| 4,666,547 | A | * | 5/1987 | Snowden et al. | 156/280 |
| 5,110,034 | A | * | 5/1992 | Simmonds | 228/179.1 |
| 5,311,058 | A | * | 5/1994 | Smolley | 257/691 |
| 5,650,914 | A | * | 7/1997 | DiStefano et al. | 361/704 |
| 5,767,567 | A | | 6/1998 | Hu et al. | 257/666 |
| 5,936,492 | A | | 8/1999 | Shingyoji et al. | 333/246 |
| 6,410,983 | B1 | * | 6/2002 | Moriizumi et al. | 257/723 |
| 6,593,622 | B2 | | 7/2003 | Kinzer et al. | 257/341 |
| 6,967,494 | B2 | * | 11/2005 | Kline | 324/760 |
| 7,348,550 | B2 | * | 3/2008 | Sherrer et al. | 250/239 |
| 2005/0224924 | A1 | | 10/2005 | Koh et al. | |
| 2005/0269694 | A1 | * | 12/2005 | Luechinger | 257/724 |
| 2006/0055011 | A1 | * | 3/2006 | Carney et al. | 257/676 |

\* cited by examiner

*Primary Examiner*—Ida M Soward
(74) *Attorney, Agent, or Firm*—Mikio Ishimaru

(57) ABSTRACT

An integrated circuit package system including a ribbon bond interconnect is provided, having a semiconductor device with at least one pad thereon. An external connection is provided. A heavy ribbon is provided and bonded to the external connection and to the pad on the semiconductor device.

20 Claims, 4 Drawing Sheets

INTEGRATED CIRCUIT PACKAGE SYSTEM INCLUDING RIBBON BOND INTERCONNECT

TECHNICAL FIELD

The present invention relates generally to semiconductor technology, and more particularly to an integrated circuit package system including a ribbon bond interconnect.

BACKGROUND ART

Increasing demand for high-power semiconductor dies (or "chips") with larger current carrying capacity has propelled the development of more efficient interconnect designs. Such efficient designs are particularly needed to meet the requirements of dense input/output ("I/O") and low on-state resistance ("$RDS_{ON}$") in high-power semiconductor devices. Recent dramatic advances in chip-within-chip integration have been main drivers behind these developments.

The introduction of low-k dielectric materials, ultra-thin wafer metallization, and non-passivated die tops are some of the recent advances that have substantially improved the performance of solid state power devices. Lower loss dielectrics and faster current transmission rates are additional substantial improvements that have been accomplished. Of course, cost continues to be a paramount factor in decisions regarding technology trade-offs, along with technological and performance factors.

Other factors, in addition to cost, are becoming increasingly important. Greater consideration must now also be given to the ever increasing complexity of package interconnect designs. Similarly, increasing market competition is advancing and intensifying the need for high design confidence along with shorter design cycle times.

One key design consideration is simplification of bonding diagrams and bonding processes for die interconnection. For example, conventional device layout for a power metal oxide semiconductor field effect transistor ("power MOSFET") is limited and is technologically difficult due to the use of conventional contact point arrangements of lead wires connected to the source contact of the power MOSFET. This undesirably causes the $RDS_{ON}$ to be increased significantly. In one conventional device layout configuration, for example, a MOSFET connection layout using either gold ("Au") or aluminum ("Al") wires for lead-wire connections results in higher spreading resistance, which in turn leads to higher $RDS_{ON}$.

There are several ways to reduce the interconnect resistance and thereby reduce the $RDS_{ON}$. One is by using wire that has a larger diameter, which then mainly reduces the loop resistance contribution. Another is to add or utilize additional wires, which reduces the contribution of the loop resistance and reduces the spreading resistance. That is, the additional wires provide additional bond stitches. The additional bond stitches reduce the average distance between any location on the die top metallization and the nearest bond stitch, thus reducing the spreading resistance.

Unfortunately, such solutions have limits and trade-offs. For example, using larger diameter wire typically creates higher loops, thus increasing costs by requiring more wire material, as well as potentially increasing the overall size of the final package. In addition, in a multiple-wire configuration, the use of a larger wire diameter may require reducing the total number of wires, thus offsetting the gain in cross-section to a significant extent. Further, the addition of more wires reduces the wire bonding throughput of the production line due to the additional assembly operations that are necessitated, or, in the alternative, it requires additional wire bonding equipment that leads to higher device manufacturing costs. These solutions thus run against the competitive market trends of smaller die sizes, higher device current capability, and lower device costs.

As a result, there continues to be a need for improved interconnect designs for achieving lower $RDS_{ON}$, particularly for power MOSFETs which require high gate pulse current during the operation period. A need also remains, particularly in power electronics applications, for improved techniques for addressing both present and future interconnect requirements. Such techniques need to offer the same advantages as bonding using large Al wires, while alleviating or eliminating wire bonding limitations, such as the need to bond a significant number of parallel wires per device in order to fulfill the resistance and current requirements.

Thus, a need still remains for improved interconnect designs and configurations for dies in semiconductor devices. In view of the continuing miniaturization of such devices, and the increasing performance expectations thereof, it is ever more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including a ribbon bond interconnect. A semiconductor device with at least one pad thereon is provided. An external connection is provided. A heavy ribbon is provided and bonded to the external connection and to the pad on the semiconductor device.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
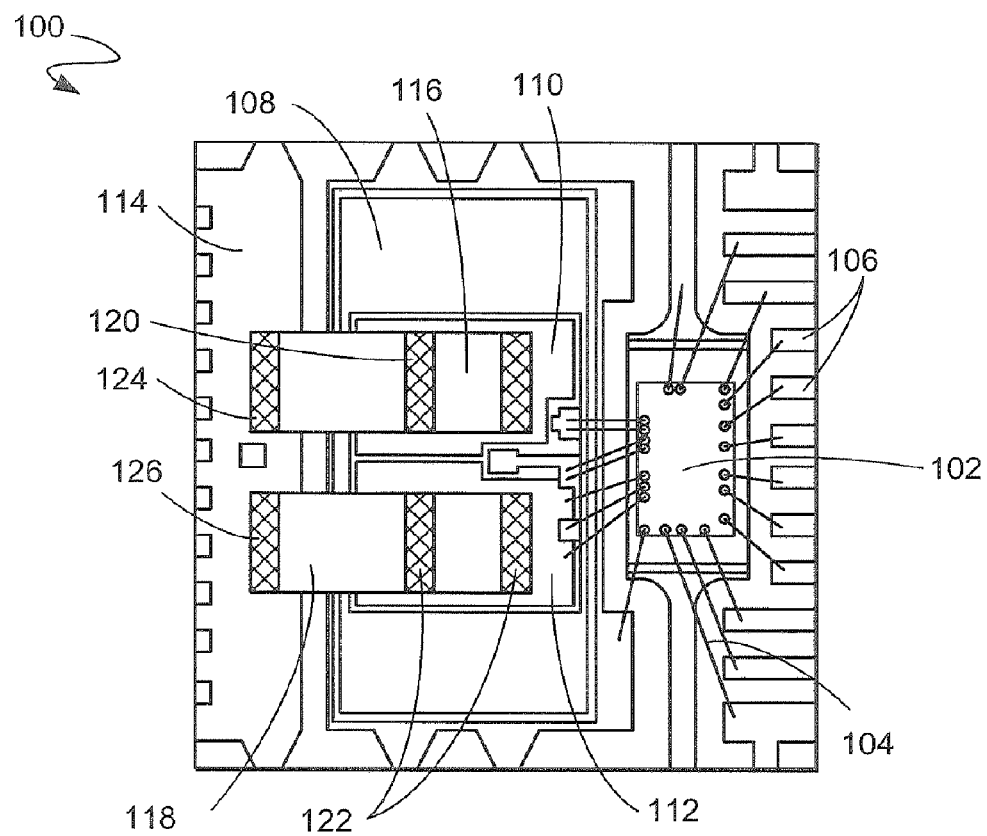
FIG. 1 is a top plan view of a portion of a device bond diagram for a scalable power semiconductor switch device incorporating an embodiment of an integrated circuit package system including a ribbon bond interconnect according to the present invention.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the devices are semi-diagrammatic and not to scale and, particularly, some of the dimensions are for the clarity of presentation and are shown exaggerated in the drawing FIGS. Also, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the semiconductor chip or die regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

As will be described more particularly below, the present invention discloses an integrated circuit package system including a ribbon bond interconnect. The invention, in one embodiment, has particular utility for interconnection of a semiconductor power metal oxide semiconductor field effect transistor ("power MOSFET"), for example in a quad flat non-leaded ("QFN") package form factor. As described further below, an exemplary embodiment relates to a novel and improved interconnect system that uses a heavy aluminum ("Al") or Al-alloy ribbon bond to achieve lower device drain-to-source overall resistance, including lower on-state resistance ("$RDS_{ON}$"), by lowering the interconnect spreading resistance and loop resistance.

In one embodiment, a single stitch bond configuration is disclosed; in another, multiple stitches and multiple continuous stitches are disclosed. Significant improvements are then achieved with these configurations, chiefly due to the larger active bond surface thereof that is in contact with the die top metallization that connects to the lead terminals of a package such as a leadframe based QFN package.

Accordingly, substantial improvements in reducing overall $RDS_{ON}$ are achieved. That is, a general electrical device that is tested will have an overall resistance that is comprised of the die intrinsic resistance, lead resistance, interconnect loop resistance, and spreading resistance of the interconnect material. It has been discovered, as verified during electrical testing, that by maximizing the utilization of wire bonding pad size using heavy ribbon bond (for example, an Al or Al-alloy ribbon dimensioned above 40 mil×4 mil in cross section), substantially reduced overall device $RDS_{ON}$ is achieved.

The present invention thus achieves a substantial improvement over prior wire bonding, multiple wire bonding, and the effective equivalent of small ribbon bonding. By using a heavy ribbon bond, for example of either Al or any related Al-alloy, the interconnect solution of the present invention unexpectedly meets the requirements of low device overall $RDS_{ON}$ and high current carrying capacity. This can, for example, thereby provide a substantially improved version of power MOSFET packages in a compact QFN form factor.

Referring now to FIG. 1, therein is shown a top plan view of a portion of a device bond diagram 100. The device bond diagram 100 is for a scalable power semiconductor switch ("SPSS") device that incorporates an embodiment of an integrated circuit package system including a ribbon bond interconnect according to the present invention.

A semiconductor die 102 is connected by bonding wires 104 to leads 106 of a leadframe and to pads on another die, such as a power MOSFET 108. The power MOSFET 108 includes metallized interconnect pads, such as a pad 110 and a pad 112, for making high current capacity connections to external power and/or ground pads or sources, such as, for example, an external ground 114.

It has been discovered that a much more effective and economical connection can be made between the pads 110 and 112 of the power MOSFET 108 and the external ground 114 (as well as other external power pads and connections, not shown) by using heavy Al or Al-alloy ribbon rather than Al wires, whether single wires or multiple. The term "heavy" refers to Al ribbon that is substantial and robust, ranging for example from about 40 mil×4 mil in cross section to about 80 mil×8 mil. The exact dimensions and range will depend, of course, upon the current requirements and the bonding pad width and length that are needed for the particular application at hand. The dimensions just given are therefore representative dimensions for semiconductor device configurations such as shown in FIG. 1.

Accordingly, it will be clear to one of ordinary skill in the art, based on this disclosure, that changes and variations in these dimensions may be made according to the needs and characteristics of other configurations and applications. Of importance to the present invention is the unexpected discovery, as disclosed and further described herein, that a heavy Al/Al-alloy ribbon size can be used that is substantially more robust than prior connection conductors, such as Al wire.

A heavy ribbon 116 thus connects the pad 110 to the external ground 114, and a heavy ribbon 118 connects the pad 112 to the external ground 114. The heavy ribbons 116 and 118 are connected by respective stitches 120 and 122 to the respective pads 110 and 112, and by stitches 124 and 126 to the external ground 114. The stitches 120, 122, 124, and 126 that bond the heavy ribbons 116 and 118 to the pads 110 and 112 and to the external ground 114 may be formed, for example, by ultrasonic bonding in a criss-crossing, mesh bonding pattern, as shown in FIG. 1. The mesh-stitches 120, 122, 124, and 126 provides about double the bond strength of single line bonds and increases mold compound adhesion to a similar extent.

The rectangular cross-sectional geometry of the heavy ribbons 116 and 118 allows the width and the thickness to be chosen independently both for the geometry of a given heavy ribbon and also with respect to each particular heavy ribbon independently. Thus, for a given heavy ribbon, its particular width and its particular thickness may each be independently selected according to the geometries and the current-carrying conditions at hand. This also provides for utilizing the surface of the die contact area, such as the pads 110 and 112, much more effectively and efficiently than can be obtained with a round wire geometry. This aspect becomes increasingly significant with shrinking die sizes.

Another unexpected aspect of the heavy ribbons 116 and 118 is that they eliminate the need for inter-conductor space. Inter-conductor space is a requirement when multiple adjacent wires are utilized, and is needed to allow for proper bonding of the wires to the pads. Instead, the geometry of the heavy ribbons 116 and 118 fills that space and therefore allows the use of a lesser overall thickness at identical or even larger equivalent total loop cross-sections.

The lesser thickness of the heavy ribbons 116 and 118, as compared with an Al wire or wire cluster of corresponding conductivity, is additionally advantageous in several respects. For example, it allows the formation of lower-height interconnect loops, such as are required for thinner packages.

It has been further discovered that such heavy ribbons are also easier to bond to the pads and to external power connections. That is, with round wires, ultrasonic bonding generally becomes increasingly difficult with increasing wire diameters (thickness). This is because the ultrasonic energy needs to be transmitted through the entire loop of the wire to reach the bond interface to create a stronger bond. The thinner the interconnect material, therefore, the more robust the bond process will be. Accordingly, it has been discovered that the thinner and much broader profile of the heavy ribbons 116 and 118 of the present invention unexpectedly provide significantly more robust and successful bonding than has been obtainable with equivalent round connection wires.

It has also been discovered that the heavy Al or Al-alloy ribbon bonding of the present invention also offers less risk of cratering of the pads and the power connections, such as the pads 110 and 112 and the external ground 114. This is because the bond force and the ultrasonic energy are distributed substantially evenly to and over the heavy ribbon on a larger area along a linear portion thereof and across substantially the whole width thereof. This is especially advantageous, compared with prior processes, during the initial stage of the bond process. That is, the flat external profile of the heavy ribbon immediately contacts a broad portion (and potentially all) of the underlying contact pad. But a round wire starts initially with only a line contact, causing a great concentration of force and energy in a small area that then precipitates cratering. The reduced penetration of the die metallization (e.g., the pads) by the heavy ribbon bonds therefore yields production improvements as well as performance improvements, and heavy ribbons bonded by this process will have the characteristics of such generally evenly distributed bond force bonding. This accordingly results in lower yield loss levels as compared with heavy Al wire bonding.

The improved bonding by the heavy ribbons 116 and 118 also causes lower stress at and near the underlying structure of the silicon ("Si") die.

Yet another benefit of the heavy Al ribbon bonding, as compared with multiple heavy Al wire bonding, is the overall reduced number of bonds that are required on a die. This also leads to a lower number of defects.

The embodiment shown in FIG. 1 utilizes the present invention for ribbon bond interconnection in a 12×12 power hybrid QFN package. In this embodiment, the former device configuration that used 6×15 mil Al wires has been replaced with the heavy ribbons 116 and 118 in an 80 mil×8 mil Al ribbon configuration. The heavy ribbons 116 and 118 provide interconnection bonds that yield equivalent electrical performance and reliability in terms of the device overall $RDS_{ON}$.

Figure 2:
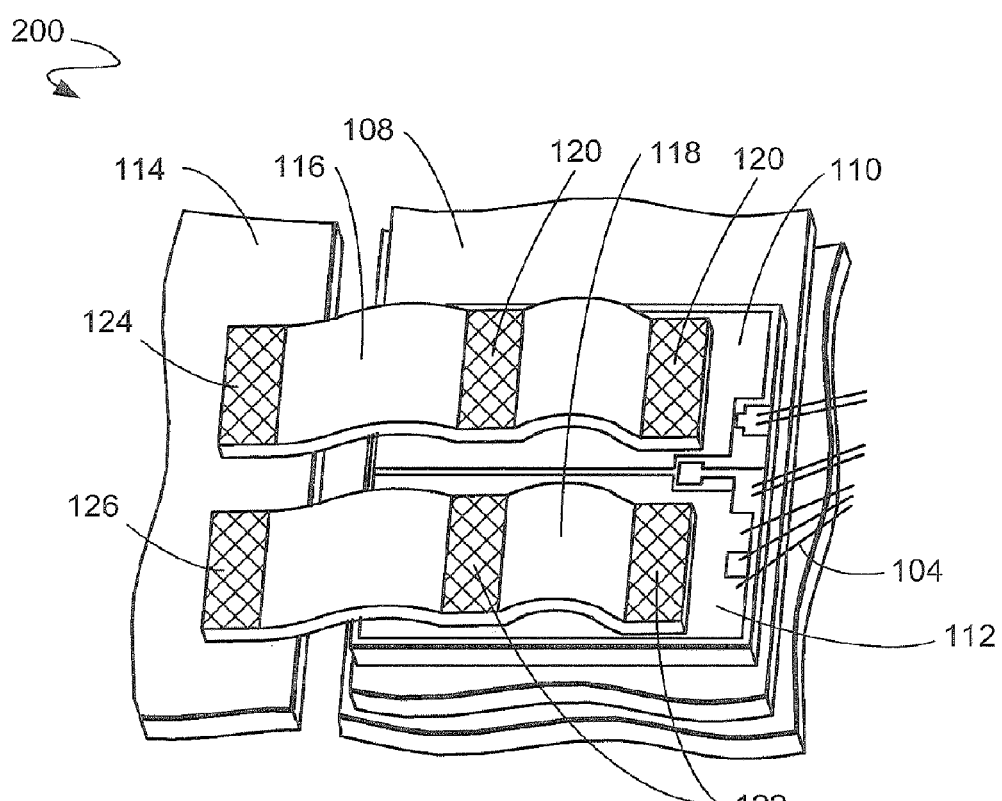
FIG. 2 is an enlarged perspective view of a portion of a scalable power semiconductor switch device fabricated in accordance with the device bond diagram of FIG. 1.

Referring now to FIG. 2, therein is shown an enlarged perspective view of a portion 200 of an SPSS device fabricated in accordance with the device bond diagram 100 (FIG. 1).

Figure 3:
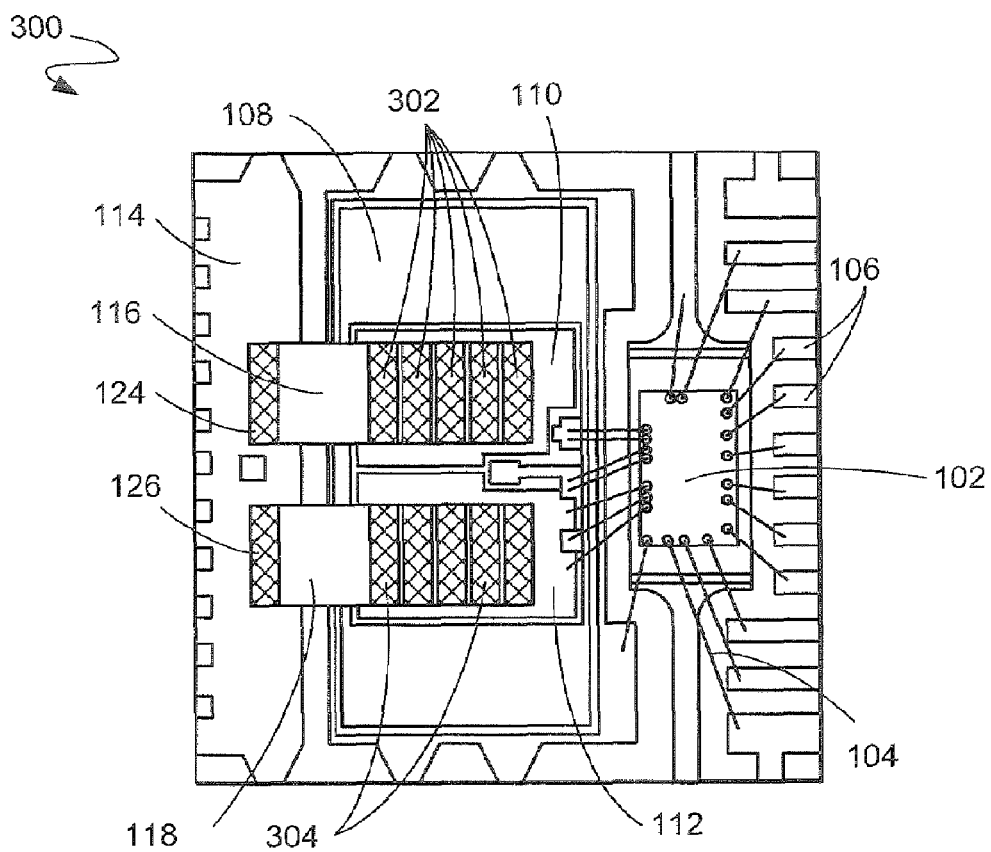
FIG. 3 is a top plan view of a portion of a device bond diagram for a scalable power semiconductor switch device similar to that shown in FIG. 1 and incorporating a further embodiment of a ribbon bond interconnect according to the present invention.

Referring now to FIG. 3, therein is shown a top plan view of a portion of a device bond diagram 300 for an SPSS device similar to that shown in FIG. 1. In the device bond diagram 300, however, the heavy ribbons 116 and 118 are stitched to the pads 110 and 112 respectively by five continuous stitches 302 and 304, for even better connection to the pads 110 and 112. The continuous stitches 302 and 304 are arranged in parallel to the die bondable surfaces (e.g., the pads 110 and 112 and the external ground 114) in order to achieve a larger effective interconnect area size.

Figure 4:
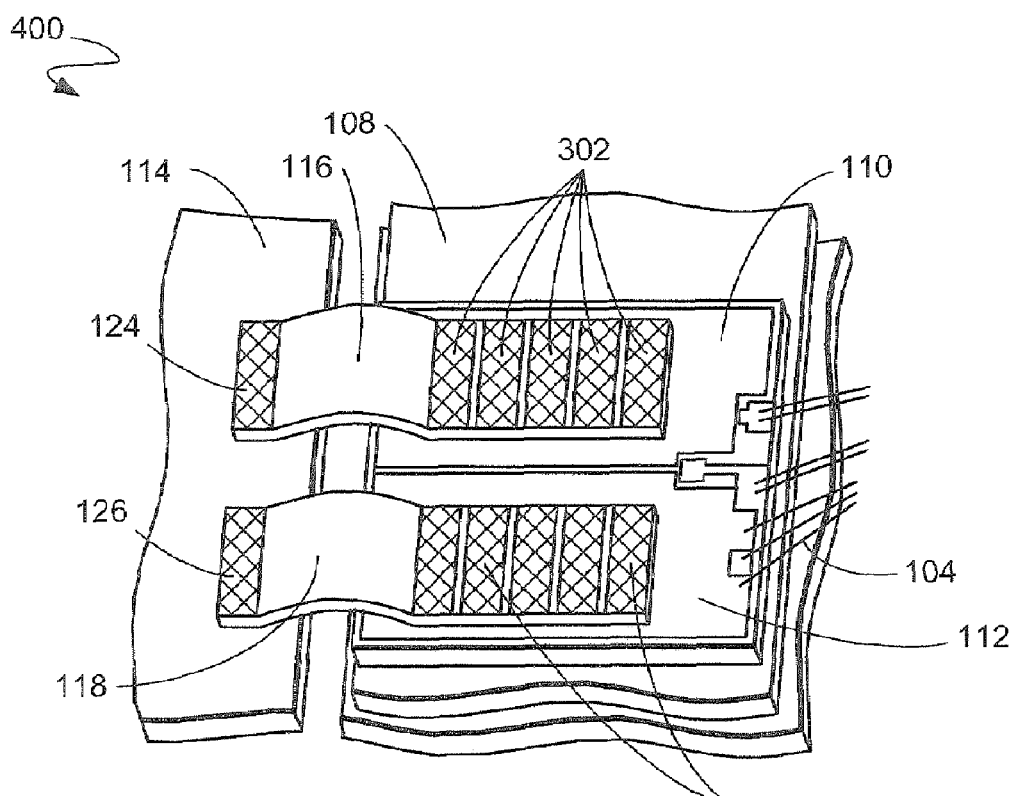
FIG. 4 is an enlarged perspective view of a portion of a scalable power semiconductor switch device fabricated in accordance with the device bond diagram of FIG. 3.

Referring now to FIG. 4, therein is shown an enlarged perspective view of a portion 400 of an SPSS device fabricated in accordance with the device bond diagram 300 (FIG. 3).

Figure 5:
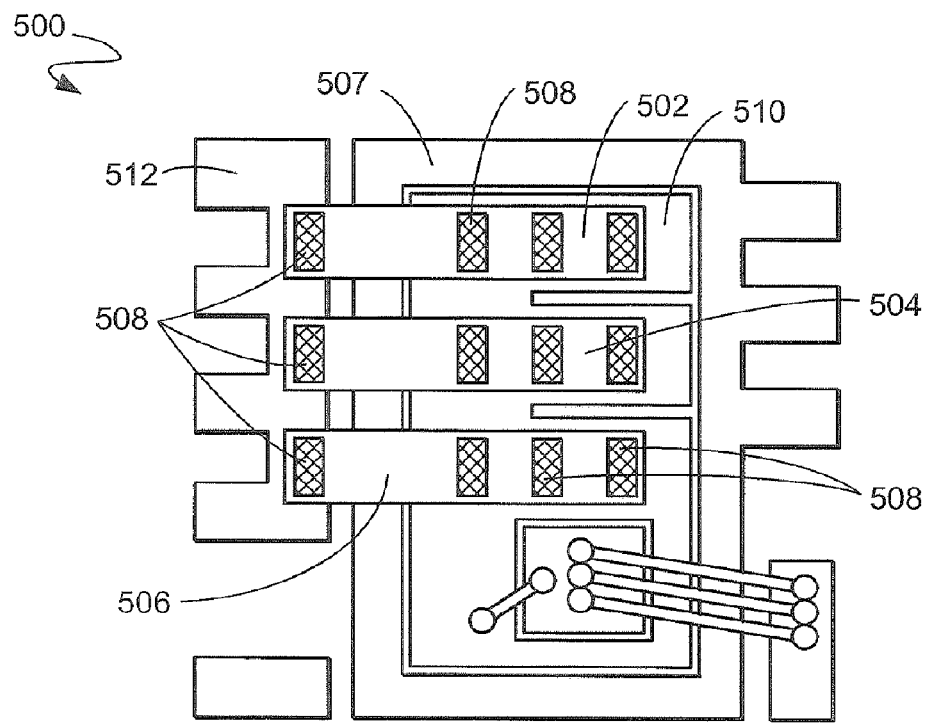
FIG. 5 is a top plan view of a portion of a device bond diagram for power interconnections for a quad flat non-leaded package.

Referring now to FIG. 5, therein is shown a top plan view of a portion of a device bond diagram 500 for power interconnections for a QFN package. Heavy ribbons 502, 504, and 506 are connected by stitches 508 to a pad 510 and an external connection or pad, such as an external ground 512. In this embodiment the three heavy ribbons 502, 504, and 506 are 60 mil×8 mil Al/Al-alloy ribbons that replace 6×12 mil Al wires in a power MOSFET driver package. Among the various aspects of this configuration are faster bonding units per hour ("UPH") and lower device $RDS_{ON}$.

Figure 6:
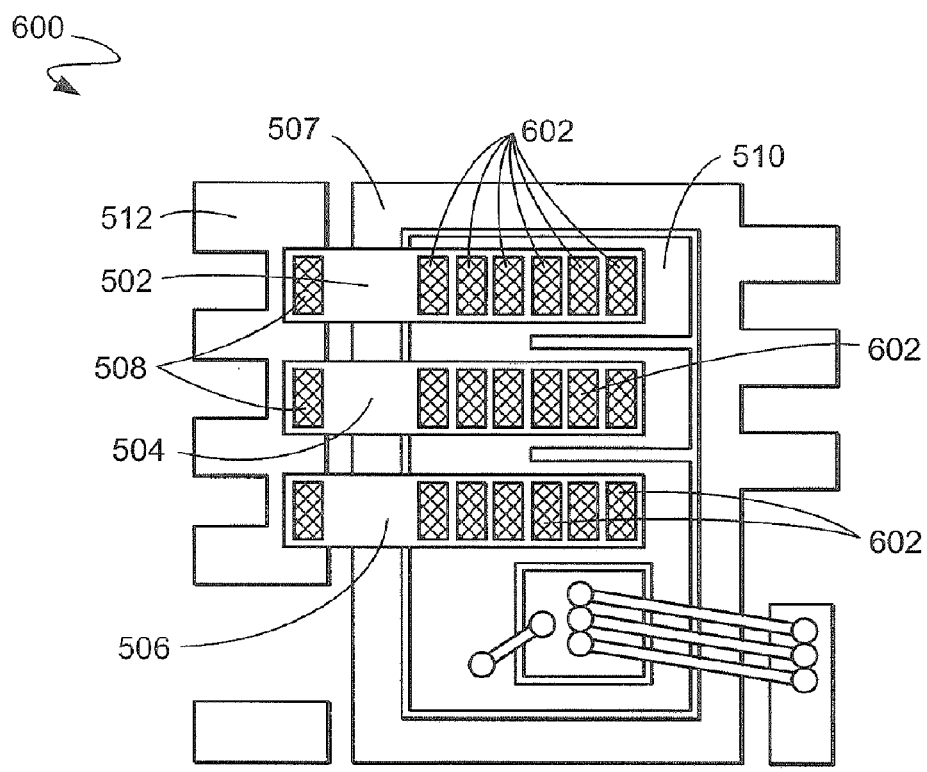
FIG. 6 is a top plan view of a portion of a device bond diagram for power interconnections for a quad flat non-leaded package similar to that shown in FIG. 5 and incorporating a further embodiment of a ribbon bond interconnect according to the present invention.

Referring now to FIG. 6, therein is shown a top plan view of a portion of a device bond diagram 600 for power interconnections for a QFN package similar to that shown in FIG. 5. In the device bond diagram 600, however, the heavy ribbons 502, 504, and 506 are each stitched to the pad 510 by six continuous stitches 602, for even better connection to the pad 510. In this embodiment, better bond processability yield is captured with superior low $RDS_{ON}$.

Reliability testing of embodiments of the present invention produced the following results. Heavy Al ribbon bond configurations using double stitch and using five continuous stitch bonds in power QFN packages were subjected to a high temperature storage life ("HTSL") test of 150° C. for 1,000 hours, an autoclave test (100% relative humidity, pressure=15 psi, and temperature=121° C.) at 192 hours, and temperature cycling (−65° C. to 150° C.) for 1,000 cycles after moisture sensitivity levels ("MSL") L3 and L2a pre-conditioning with 3×IR reflow at 260° C. All of these reliability tests showed a 100% passing rate outcome.

It has been discovered that the present invention is thus able to achieve the same or better interconnect resistance with a significantly lower number of conductors, and can do so for virtually all types of discreet power packages. Thus, the same or better electrical performance is provided at lower costs. For example, if a particular embodiment employs half the number of heavy ribbons in comparison to the prior use of round wires, then the number of required wire bonders will be approximately half, as well as half the number of consumables (e.g., bond tools, wire/ribbon guides, cutter blades, clamp tooling, and so forth).

It has also been unexpectedly discovered that the heavy Al/Al-alloy ribbon of the present invention affords a significant savings in the amount and cost of the Al/Al-alloy material. That is, although the same cross-sectional area is typically required compared with equivalent multiple wire connections, the material length of the heavy ribbon is reduced, for example by a factor of 2, thus significantly lowering the ribbon manufacturing costs.

Consequently, the present invention achieves lower device overall $RDS_{ON}$, such as for a power MOSFET device, with excellent reliability performance, a more robust interconnect structure, and cost reductions, such as in terms of wire usages and manufacturing complexities, costs, and production times.

It has also been unexpectedly discovered that the present invention significantly reduces, if not completely eliminates, prior observed frequent non-stick-on-pad ("NSOP") on the stitching of large Al wire bonds (for example, 15 mils) in a double stitch configuration. The present invention also provides higher bonding UPH, while achieving improved low interconnect $RDS_{ON}$ for better electrical performance, and lower resistance spreading effects, for high current power devices.

The present invention is also superior to other alternatives, such as copper ("Cu") wedge bonds, which are limited to smaller wire size (e.g., 2-6 mils), thus resulting in an adverse increment of required wire quantity per device. Similarly, the present invention is also a significant improvement over the use of smaller Al wire (e.g., 12 mils), which requires more wire quantity to achieve the equivalent resistance and electrical performance. Further, both such alternatives result in lower bonding UPH, complicated bond diagrams with more wires, and require additional space for bonding and wedge tool navigation.

Figure 7:
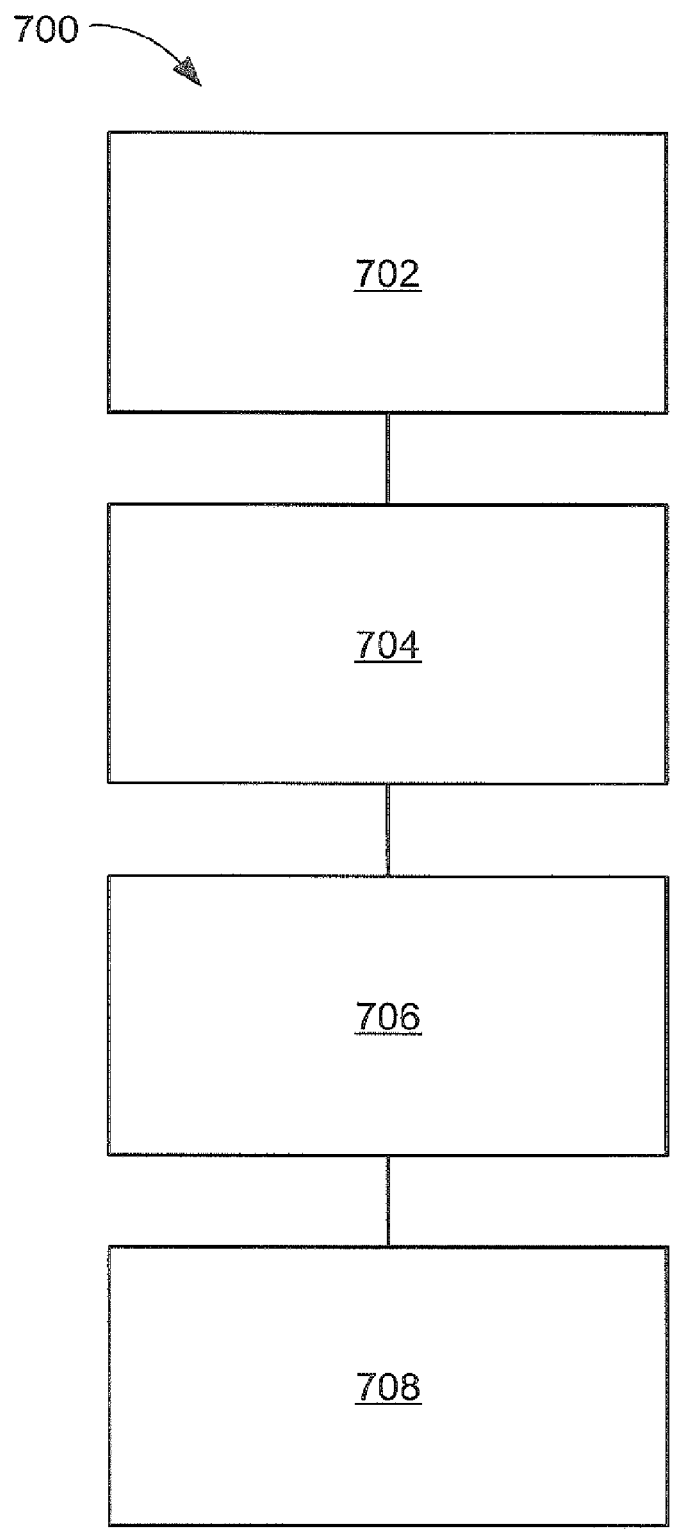
FIG. 7 is a flow chart of an integrated circuit package system including a ribbon bond interconnect in accordance with an embodiment of the present invention.

Referring now to FIG. 7, therein is shown a flow chart of an integrated circuit package system 700 including a ribbon bond interconnect in accordance with an embodiment of the present invention. The system includes providing a semiconductor device having at least one pad thereon in a block 702; providing an external connection in a block 704; providing a heavy ribbon in a block 706; and bonding the heavy ribbon to the external connection and to the pad on the semiconductor device in a block 708.

It has been discovered that the present invention thus has numerous aspects.

A principle aspect of the present invention is that it provides lower overall interconnect resistance for high current power devices.

Another aspect is that it provides a significantly higher UPH bonding rate compared to prior wire wedge bonding methods.

Yet another aspect is that the higher UPH bonding rate results in a higher output at an equivalent capital asset requirement.

Another aspect is that the higher output at equivalent capital asset requirements results in less machine-related down time and less spare parts replacement.

Still another aspect is that the higher throughput results in a reduced need for bonding equipment, thereby reducing the costs associated therewith.

Yet another aspect is that the more robust package die-to-lead interconnection afforded by the heavy Al/Al-alloy ribbon size eliminates the need for an on-site pull station.

Still another aspect is that the invention affords a more robust, heavier, and bulkier interconnect material. Among other benefits, this provides greater stability during molding of the semiconductor package.

Another important aspect is that a more lasting bond is created having better reliability performance, due in part to characteristic differences in the bonding material, stronger bond shear strength, and minimum ribbon wear out and corrosion.

Another aspect is that a lower bond force per unit area is applied to the die top metallization.

Yet another aspect is that the bond force is distributed evenly to and over a larger wedge bond surface, thereby avoiding cratering due to the direct impact of ultrasonic force.

Another aspect is that the heavy Al ribbon bond affords a better current carrying capacity.

Still another aspect is that the present invention can provide a faster time-to-market as a direct replacement for certain Al wire bond configurations and processes, such as, for example, power QFN packages.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system including a ribbon bond interconnect of the present invention furnishes important and heretofore unknown and unavailable solutions, capabilities, and functional aspects for interconnecting semiconductor devices and device elements. The resulting processes and configurations are straightforward, cost-effective, uncomplicated, highly versatile and effective, can be implemented by adapting known technologies, and are thus readily suited for efficiently and economically manufacturing high performance semiconductor devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. An integrated circuit package system including a ribbon bond interconnect, comprising:
   providing a semiconductor device having at least one pad thereon;
   providing an external connection;
   providing a heavy ribbon; and
   bonding the heavy ribbon to the external connection and to the pad on the semiconductor device, the bonding providing mesh-stitches on the heavy ribbon.

2. The system of claim 1 wherein bonding further comprises bonding with a plurality of stitches to at least the external connection or the pad on the semiconductor device.

3. The system of claim 1 wherein bonding further comprises bonding with a plurality of continuous stitches.

4. The system of claim 1 wherein the heavy ribbon has a cross-sectional dimension of at least 40 mil×4 mil.

5. The system of claim 1 wherein bonding further comprises applying a bond force distributed substantially evenly to and over the heavy ribbon along a predetermined portion thereof and across substantially the whole width thereof.

6. An integrated circuit package system including a ribbon bond interconnect, comprising:
   providing a semiconductor device having at least one pad thereon;
   providing an external pad;
   providing a heavy aluminum or aluminum-alloy ribbon; and bonding the heavy aluminum or aluminum-alloy ribbon to the external pad and to the pad on the semiconductor device, the bonding having criss-crossing mesh-stitches to bond the heavy aluminum or aluminum-alloy ribbon to the external pad and the at least one pad.

7. The system of claim 6 wherein bonding further comprises bonding with a plurality of stitches to at least the external pad or the pad on the semiconductor device.

8. The system of claim 6 wherein bonding further comprises bonding with a plurality of continuous ultrasonic stitch bonds.

9. The system of claim 6 wherein the heavy aluminum or aluminum-alloy ribbon has a cross-sectional dimension of at least 40 mil×4 mil.

10. The system of claim 6 wherein bonding further comprises applying a bond force distributed substantially evenly to and over the heavy aluminum or aluminum-alloy ribbon along a predetermined portion thereof and across substantially the whole width thereof.

11. An integrated circuit package system including a ribbon bond interconnect, comprising:
a semiconductor device having at least one pad thereon;
an external connection; and
a heavy ribbon bonded to the external connection and to the pad on the semiconductor device, the heavy ribbon bond having mesh-stitches to bond the heavy ribbon to the pad.

12. The system of claim 11 further comprising a plurality of stitches bonding the heavy ribbon to at least the external connection or the pad on the semiconductor device.

13. The system of claim 11 wherein the heavy ribbon is bonded with a plurality of continuous stitches.

14. The system of claim 11 wherein the heavy ribbon has a cross-sectional dimension of at least 40 mil×4 mil.

15. The system of claim 11 wherein the heavy ribbon has the characteristics of bonding by applying a bond force distributed substantially evenly to and over the heavy ribbon along a predetermined portion thereof and across substantially the whole width thereof.

16. An integrated circuit package system including a ribbon bond interconnect, comprising:
a semiconductor device having at least one pad thereon;
an external pad;
a heavy aluminum or aluminum-alloy ribbon bonded to the external pad and to the pad on the semiconductor device, the heavy ribbon bond having criss-crossing mesh-stitches to bond the heavy aluminum or alunimum-alloy ribbon to the external pad and the at least one pad.

17. The system of claim 16 further comprising a plurality of stitches bonding the heavy aluminum or aluminum-alloy ribbon to at least the external pad or the pad on the semiconductor device.

18. The system of claim 16 wherein the heavy aluminum or aluminum-alloy ribbon is bonded with a plurality of continuous ultrasonic stitch bonds.

19. The system of claim 16 wherein the heavy aluminum or aluminum-alloy ribbon has a cross-sectional dimension of at least 40 mil×4 mil.

20. The system of claim 16 wherein the heavy aluminum or aluminum-alloy ribbon has the characteristics of bonding by applying a bond force distributed substantially evenly to and over the heavy aluminum or aluminum-alloy ribbon along a predetermined portion thereof and across substantially the whole width thereof.

* * * * *

UNITED STATES PATENT AND TRADEMARK OFFICE
CERTIFICATE OF CORRECTION

PATENT NO. : 7,443,018 B2 Page 1 of 1
APPLICATION NO. : 11/164087
DATED : October 28, 2008
INVENTOR(S) : Ong et al.

It is certified that error appears in the above-identified patent and that said Letters Patent is hereby corrected as shown below:

Title Page, INID (57), ABSTRACT:

Delete

"An integrated circuit package system including a ribbon bond interconnect is provided, having a semiconductor device with at least one pad thereon. An external connection is provided. A heavy ribbon is provided and bonded to the external connection and to the pad on the semiconductor device."

and insert therefore

-- An integrated circuit package system, including a ribbon bond interconnect, has a semiconductor device with at least one pad thereon. An external connection is provided. A heavy ribbon is provided and bonded to the external connection and to the pad on the semiconductor device. --

Signed and Sealed this

Twenty-third Day of December, 2008

JON W. DUDAS
*Director of the United States Patent and Trademark Office*